US006936890B2

(12) United States Patent
Hueting et al.

(10) Patent No.: US 6,936,890 B2

(45) Date of Patent: Aug. 30, 2005

(54) EDGE TERMINATION IN MOS TRANSISTORS

(75) Inventors: Raymond J. E. Hueting, Helmond (NL); Erwin A. Hijzen, Blanden (BE); Michael A. A. In't Zandt, Veldhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 114 days.

(21) Appl. No.: 10/236,175

(22) Filed: Sep. 6, 2002

(65) Prior Publication Data

US 2003/0047776 A1 Mar. 13, 2003

(30) Foreign Application Priority Data

Sep. 13, 2001 (GB) ............................................. 0122120

(51) Int. Cl.[7] ....................... H01L 27/108; H01L 29/76; H01L 29/94; H01L 31/119

(52) U.S. Cl. ....................................... 257/330; 257/331

(58) Field of Search ................................ 257/329, 330, 257/333, 339, 341, 471, 476, 488

(56) References Cited

U.S. PATENT DOCUMENTS

| | | | | |
|---|---|---|---|---|
| 4,754,310 A | | 6/1988 | Coe | 357/13 |
| 5,153,083 A | * | 10/1992 | Garofalo et al. | 430/5 |
| 5,385,852 A | | 1/1995 | Oppermann et al. | 437/40 |
| 5,430,324 A | * | 7/1995 | Bencuya | 257/495 |
| 5,442,216 A | * | 8/1995 | Gough | 257/355 |
| 5,528,063 A | * | 6/1996 | Blanchard | 257/335 |
| 5,637,898 A | | 6/1997 | Baliga | 257/330 |
| 5,798,549 A | * | 8/1998 | Blanchard | 257/335 |
| 5,998,833 A | | 12/1999 | Baliga | 257/329 |
| 6,037,631 A | * | 3/2000 | Deboy et al. | 257/339 |
| 6,093,640 A | * | 7/2000 | Hsu et al. | 438/631 |
| 6,331,194 B1 | * | 12/2001 | Sampayan et al. | 29/25.03 |
| 6,586,800 B2 | * | 7/2003 | Brown | 257/330 |
| 6,700,158 B1 | * | 3/2004 | Cao et al. | 257/330 |
| 2001/0006831 A1 | * | 7/2001 | Luo | 438/138 |
| 2003/0006455 A1 | * | 1/2003 | Moessner et al. | 257/329 |

FOREIGN PATENT DOCUMENTS

| | | | |
|---|---|---|---|
| DE | 19901386 A | 9/1999 | H01L/29/78 |
| WO | WO0042665 | 1/1999 | H01L/29/78 |
| WO | WO0108226 | 7/2000 | H01L/29/78 |
| WO | WO0108226 | 2/2001 | H01L/29/78 |

OTHER PUBLICATIONS

Y. C. Kao et al; "High–Voltage Planar P–N Junctions", Proceedings of the IEEE, vol. 55, No. 8, Aug. 1967, pp. 1409–1414, XP000915343.

* cited by examiner

*Primary Examiner*—Carl Whitehead, Jr.
*Assistant Examiner*—William Vesperman
(74) *Attorney, Agent, or Firm*—Aaron Waxler

(57) ABSTRACT

A RESURF trench gate MOSFET has a sufficiently small pitch (close spacing of neighbouring trenches) that intermediate areas of the drain drift region are depleted in the blocking condition of the MOSFET. However, premature breakdown can still occur in this known device structure at the perimeter/edge of the active device area and/or adjacent the gate bondpad. To counter premature breakdown, the invention adopts two principles:

the gate bondpad is either connected to an underlying stripe trench network surrounded by active cells, or is directly on top of the active cells, and a compatible 2D edge termination scheme is provided around the RESURF active device area.

These principles can be implemented in various cellular layouts e.g. a concentric annular device geometry, which may be circular or rectangular or ellipsoidal, in the active area and in the edge termination, or a device array of such concentric hexagonal or circular stripe cells, or a device array of square active cells with stripe edge cells, or a device array of hexagonal active cells with an edge termination of hexagonal edge cells.

16 Claims, 13 Drawing Sheets

EDGE TERMINATION IN MOS TRANSISTORS

This invention relates to MOS transistors and to a method of fabrication of the same.

In a low voltage trench MOS transistor (MOST) process it is preferable to implant the p-body implant after trench gate oxide formation so as to reduce outdiffusion. However, disadvantages arise with this technique, because it prevents inclusion of the p-body implant below the gate connection and gate bondpad and at the edge termination of the MOST. Consequently, reduced breakdown voltage results in these areas.

In FIG. 1, a two-dimensional plot of simulated iso-potential lines at the edge termination (or gate connection) of a trench network of an MOS transistor is shown. In the diagram, to the side of a trench 3 a poly-silicon layer 2 has been placed on top of a field oxide 4 at the top left of the diagram with a gate 9 and source 8 on the right. The substrate 6 forms a highly-doped drain electrode region below the region 5 which is a low-doped drain drift region.

All of the devices discussed herein and as shown generally in FIG. 1 are n-channel devices, having source 8 and drain regions 5 of n-type conductivity. The implant 7 is a p-type implant and an electron inversion channel is induced by the trench gate 9. By using opposite conductivity-type dopants, a p-channel device can be manufactured by a method in accordance with the invention. In such a case the source 8 and drain regions 5 are of p-type conductivity, the implant 7 is n-type and a hole inversion channel is induced by the trench gate 9.

In the example shown in FIG. 1 the epilayer concentration is 1.4×1016 cm-3, which results in a breakdown voltage in the active cells of the MOST of 40V, while at the edge the breakdown is 33V. These differences in breakdown voltage depend on the trench depth, doping concentration and device geometry and may vary.

It would be possible to solve the problem of variation in breakdown voltages and to increase the edge breakdown by using a separate p-body implantation along the edges, but that technique would take an additional mask step and is not attractive. Also, the gate connection is not straightforward in a self-aligned process, which process would be appropriate with this type of trench MOST. In FIG. 1, the point of breakdown is indicated by a star.

In addition to premature breakdown at the perimeter/edge of the active device area of a trench MOST, breakdown can additionally or alternatively occur adjacent to the gate bondpad connection to the trench network.

WO 01/08226 disclosed an advantageous edge termination for a trench gate transistor. However, the 2D (two dimensional) scheme therein disclosed does not incorporate the gate bondpad into this edge termination in any novel and advantageous manner. To do so, the edge termination needs to be addressed as a 3D (three dimensional) problem.

In this specification reference is made to the RESURF technique. For further clarification of this technique (and its use in depleting the low-doped drain drift region) reference is made to WO 01/08226, which is incorporated herein as reference material.

It is an object of the present invention to address the above mentioned disadvantages.

According to a first aspect of the present invention a semiconductor device comprises:

a semiconductor body having an active cell area wherein trenches containing gate material extend into the semiconductor body from a surface thereof, wherein adjacent to each trench gate there is a source region at said semiconductor body surface;

the semiconductor body also having an inactive cell area wherein trenches containing gate material extend into the semiconductor body from the surface thereof, wherein said source region is not present;

characterised in that a gate bondpad at least partially overlies the active cell area, or an area substantially surrounded by the active cell area, and is connected thereto.

The connection of the gate bondpad to the active cell area and the location of the gate bondpad over the active cell area advantageously eliminates or at least reduces the possibility of having premature breakdown due to the gate connection.

The gate bondpad preferably overlies and is located substantially entirely within the active cell area. A subsidiary inactive cell area may be located beneath the gate bondpad. Preferably, the subsidiary inactive cell area is contained within the active cell area.

Preferably, the perimeter of the device includes an edge termination area, preferably adjacent to the active cell area.

The edge termination area may be a trench network, preferably forming a non-floating p-type or n-type implant. The edge termination area may comprise at least one floating polysilicon spacer used as a field plate.

The edge termination area may comprise a field plate on dielectric material in a perimeter trench. Preferably, the dielectric material in the perimeter trench forms a thicker dielectric layer than a dielectric layer on said gate material in the active cell area, and the field plate is preferably present on said thicker dielectric on an inside wall of the perimeter trench without acting on any outside wall.

The edge termination area may be constructed according to a Kao ring scheme.

The edge termination area may be constructed according to existing 2D edge termination schemes, said schemes preferably providing RESURF.

Cells in the active cell area may be surrounded by a plurality of substantially concentric ring trenches. The ring trenches may be substantially circular or may be substantially elliptical. The ring trenches may be substantially polygonal, for example square ring trenches or rectangular ring trenches or hexagonal ring trenches. Consequently, the edges of the gate bondpad may have a polygonal shape according to the active cell shapes. A plurality of cells may have a common set of outer concentric ring trenches, in which case said cells may be square cells. This latter example is preferably a low voltage device.

The ring trenches may have different widths. The width of outer concentric ring trenches may be greater than inner concentric trenches.

The cells may be joined to a common gate bondpad.

The semiconductor device is preferably a trench gate device, but may be a planar gate device e.g. a VDMOS, or may be a Schottky diode or an IGBT.

According to a second aspect of the present invention a method of manufacturing a semiconductor device comprises:

forming in a semiconductor body an active cell area wherein trenches containing gate material extend into the semiconductor body from a surface thereof, and wherein adjacent to each trench gate there is provided a source region at said semiconductor body surface;

and also forming in the semiconductor body an inactive cell area wherein trenches containing gate material extend into the semiconductor body from the surface thereof, and wherein the source region is not provided;

characterised in that a gate bondpad is laid at least partially over the active cell area, or an area substantially surrounded by the active cell area, and is connected thereto.

The source region may be implanted prior to formation of said trenches.

The gate bondpad is preferably overlaid over the active area and preferably does not extend beyond the active area.

The semiconductor body may be formed having a subsidiary inactive area substantially within the active area. The subsidiary inactive area may comprises a stripe trench network of inactive cells.

All of the features disclosed herein may be combined with any of the above aspects, in any combination.

Specific embodiments of the present invention will now be described by way of example, with reference to the accompanying drawings, in which.

Figure 4A:
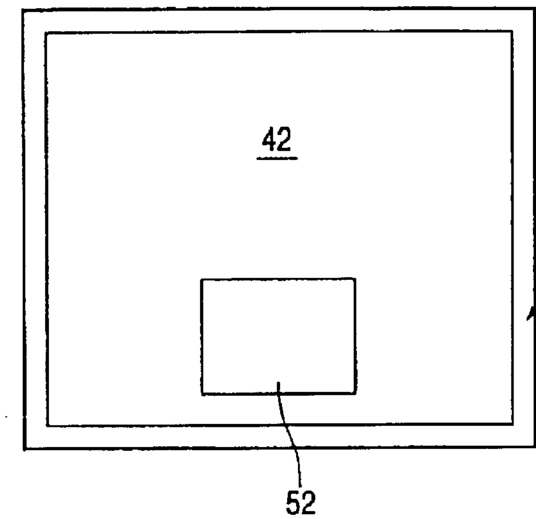
Figure 4B:
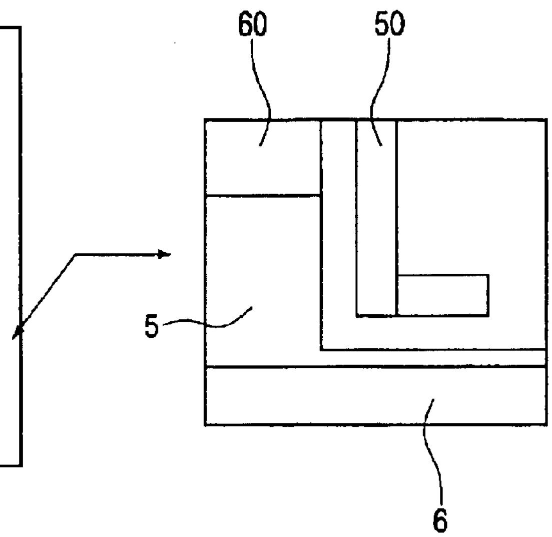

FIG. 4*a* shows a basic 3D schematic diagram from above of the concept for obtaining optimal reduced surface field (RESURF);

FIG. 4*b* shows a partial cross-sectional view from the side of the device shown in FIG. 4*a;*

Figure 5A:
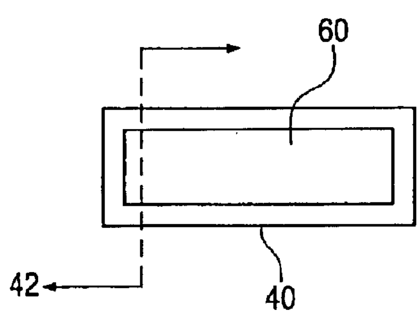
Figure 5B:
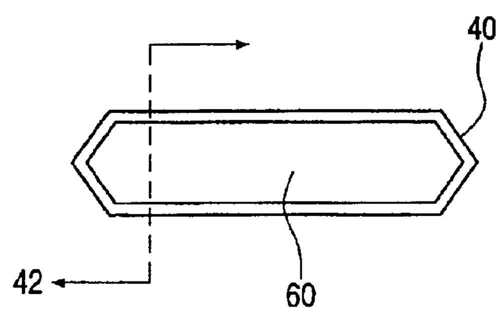
Figure 6:
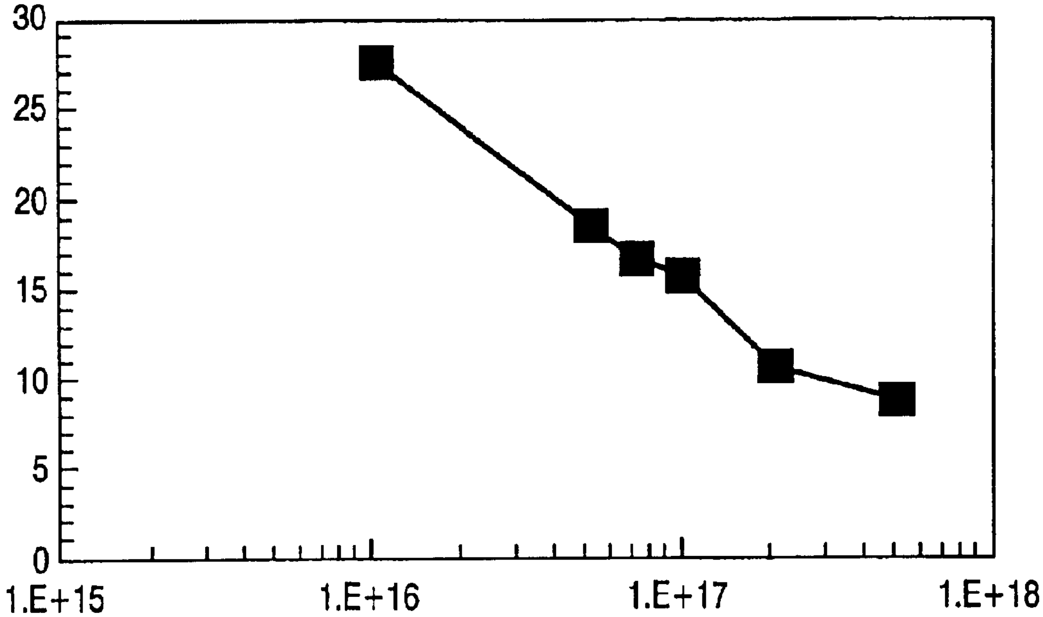
Figure 7A:
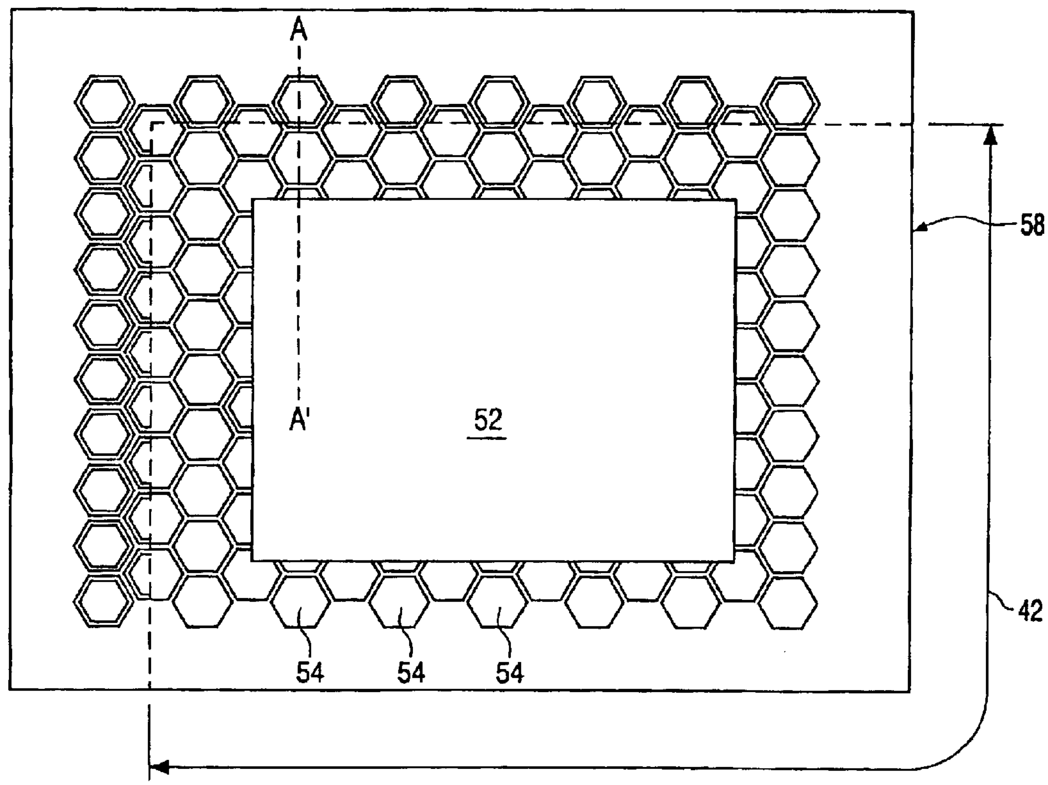
Figure 7B:
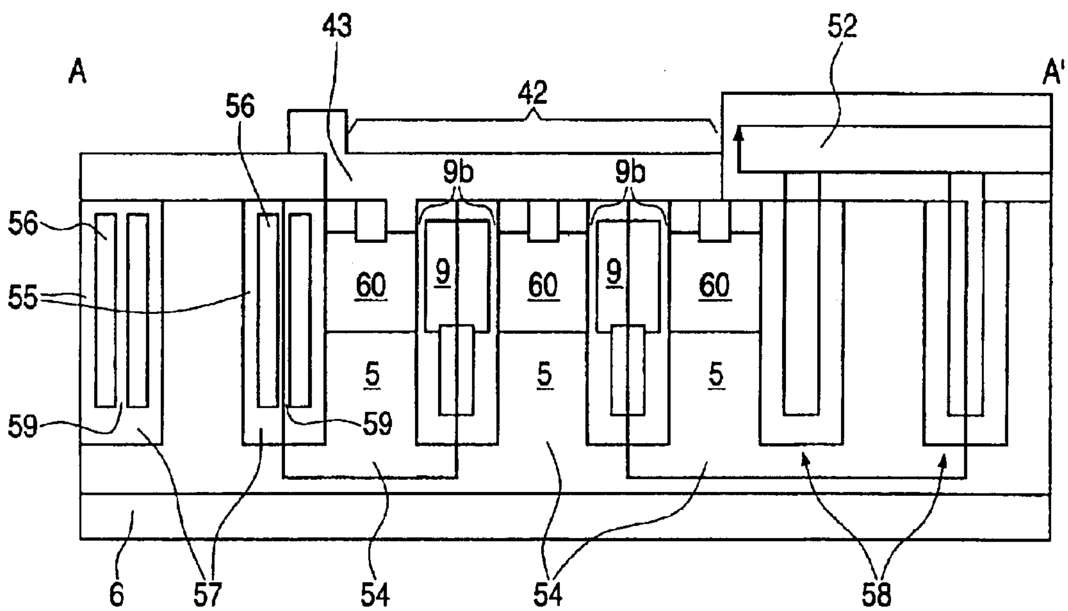

FIG. 5*a* shows a top view of a typical unit cell structure underneath the gate bondpad for square cells;

FIG. 5*b* shows a similar view to FIG. 5*a* but for hexagonal cells in the active area;

FIG. 6 shows a graph of breakdown voltage versus doping concentration for a rectangular cell;

FIG. 7*a* shows a top view of a gate bondpad located on active cells of a trench MOST;

FIG. 7*b* shows a cross-section on the line A to A' of FIG. 7*a;*

Figure 8:
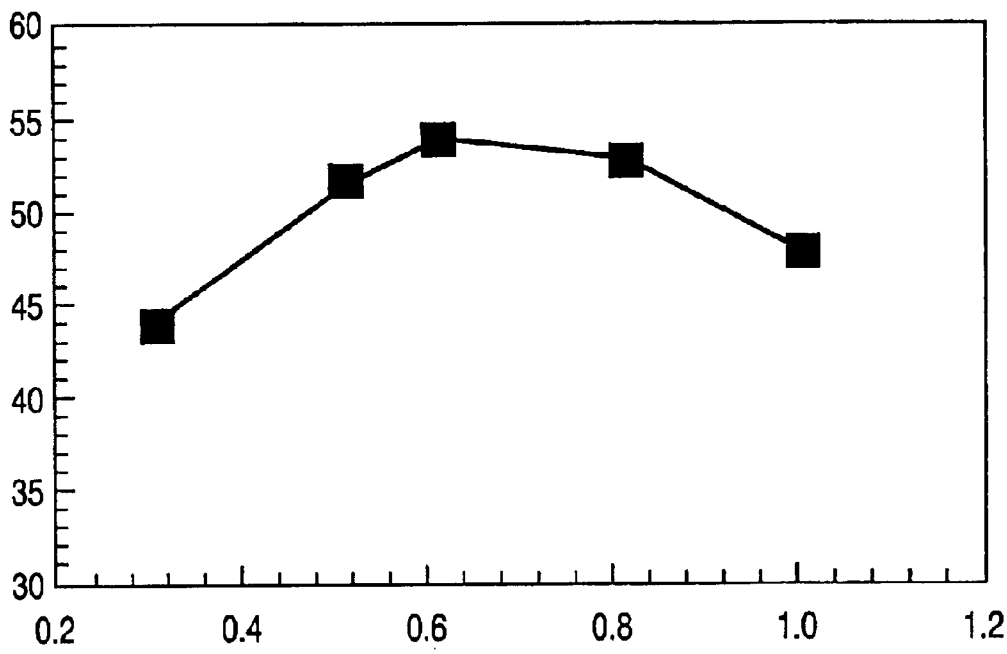
Figure 9A:
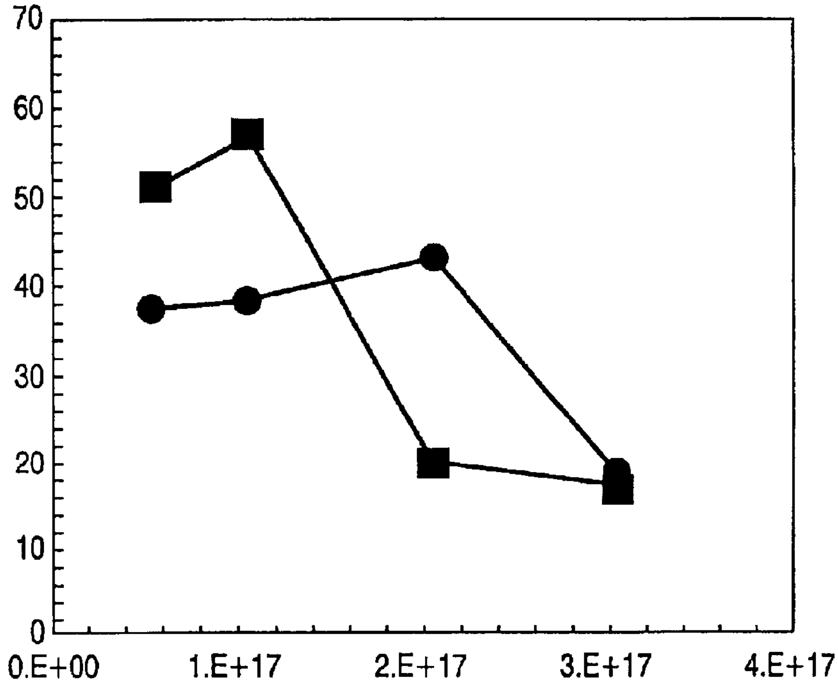
Figure 9B:
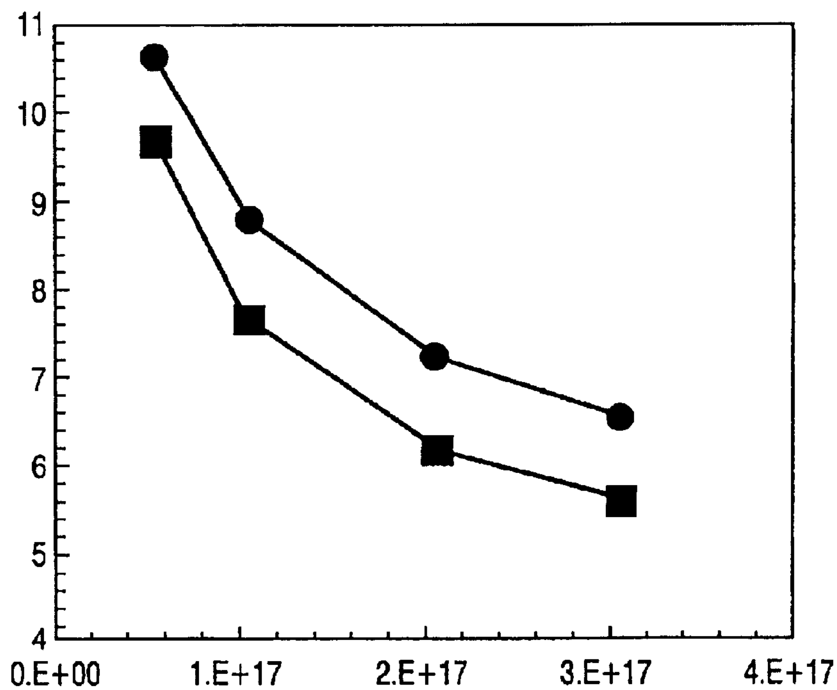

FIG. 8 shows a graph or breakdown voltage against varying mesa widths of the cells underneath the gate bondpad;

FIG. 9*a* shows breakdown voltage as a function of doping concentration for different geometries of trench network;

FIG. 9*b* shows a graph of specific on-resistance against doping concentration for the different geometries referred to in FIG. 9*a;*

Figure 10A:
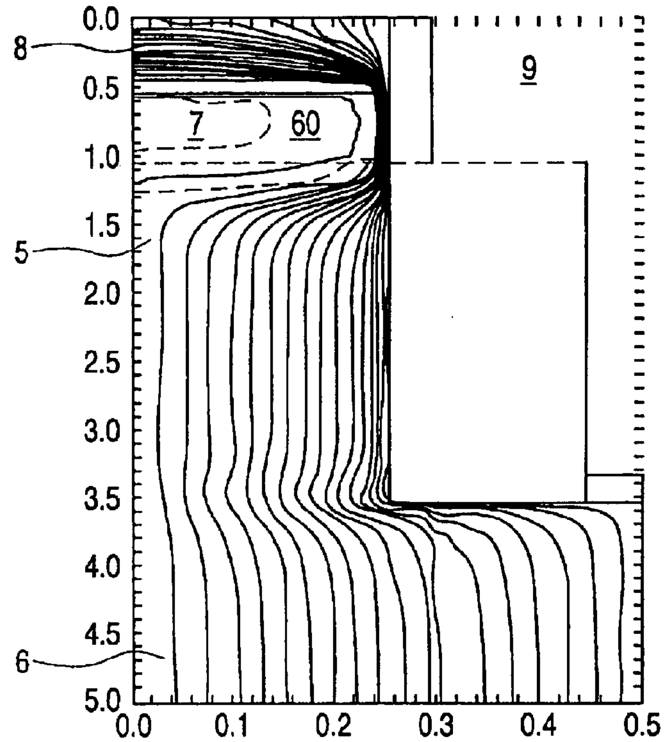
Figure 10B:
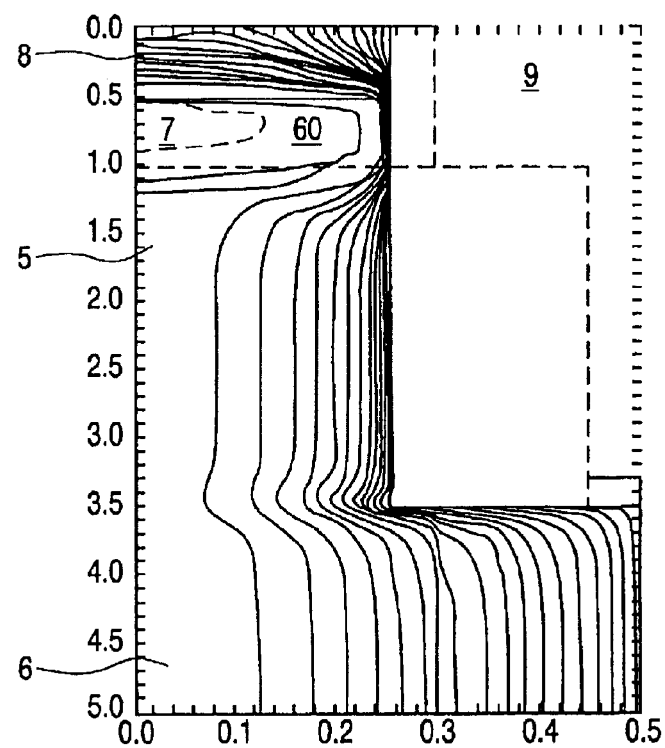
Figure 11:
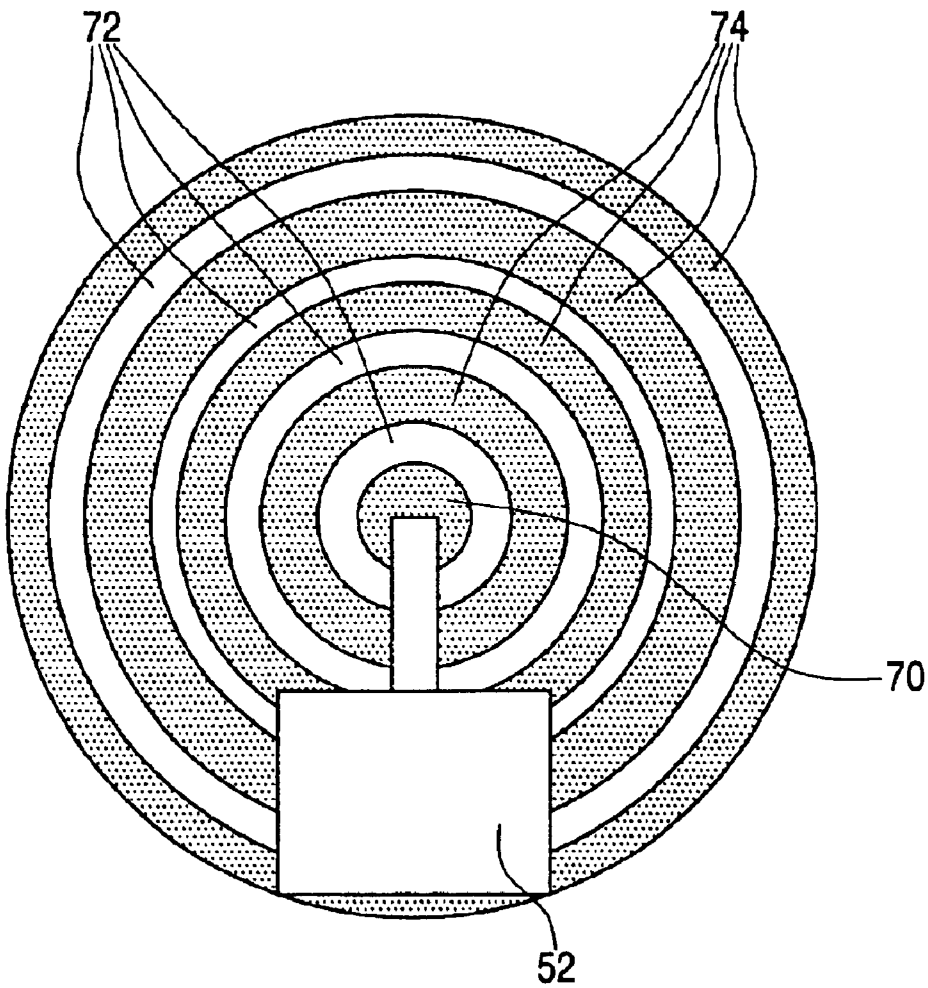
Figure 12A:
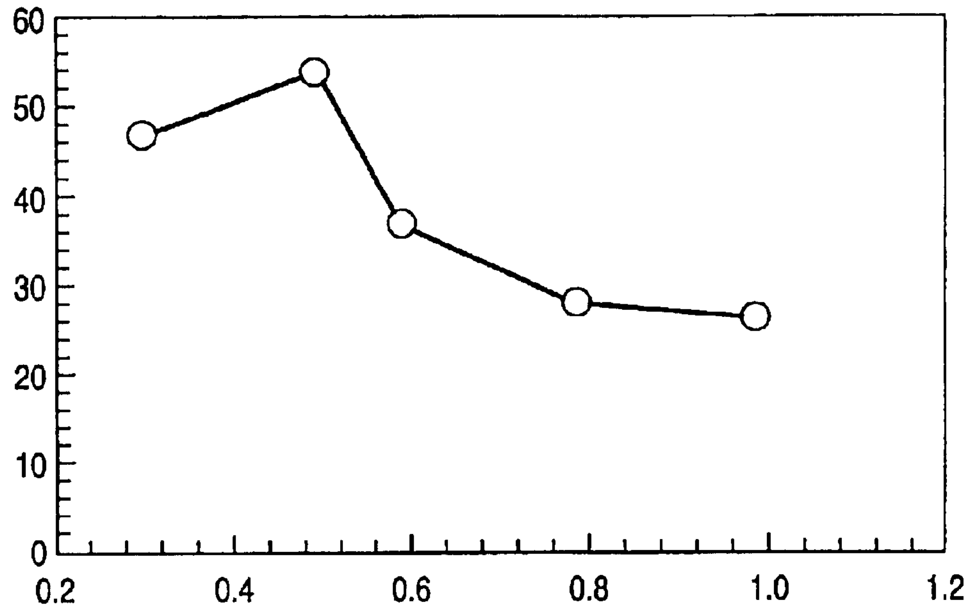
Figure 12B:
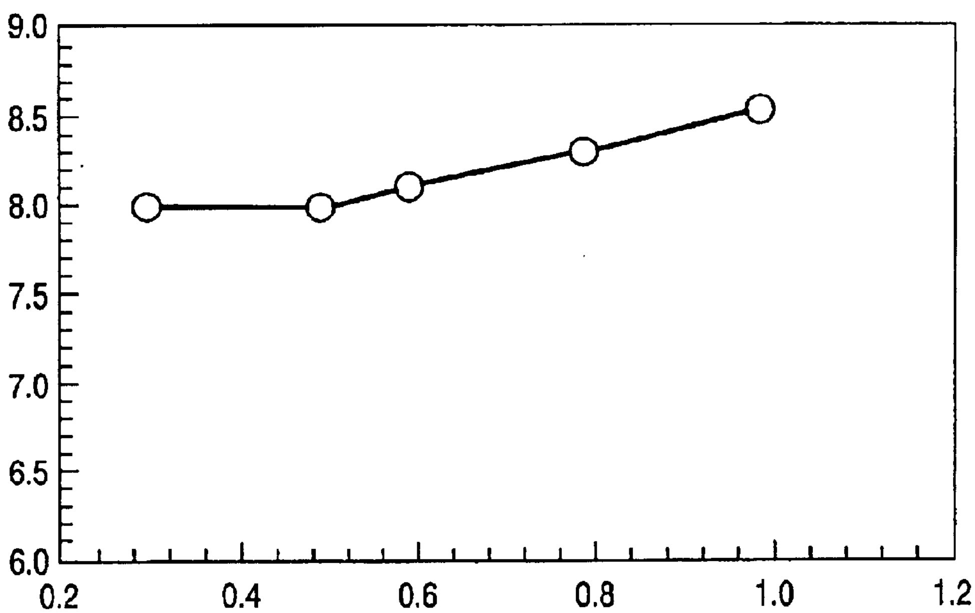

FIG. 10*a* shows a schematic cross-sectional side view of current flows of the RESURF hexagon cells;

FIG. 10*b* is similar to FIG. 10*a* but shows flows for stripe cells;

FIG. 11 shows a schematic top view of a 3D RESURF device having circular stripe cells;

FIGS. 12*a*, 12*b* respectively show simulations of breakdown voltage and specific on-resistance for the device shown in FIG. 11 with three trench rings (2 unit cells); and FIGS. 13*a–f* show different device layouts for RESURF devices having square active cells with stripe edge cells;

hexagon stripe cells;

circle stripe cells;

rectangular stripe cells;

ellipsoid stripe cells, and hexagon active cells with hexagon edge cells.

Figure 1:
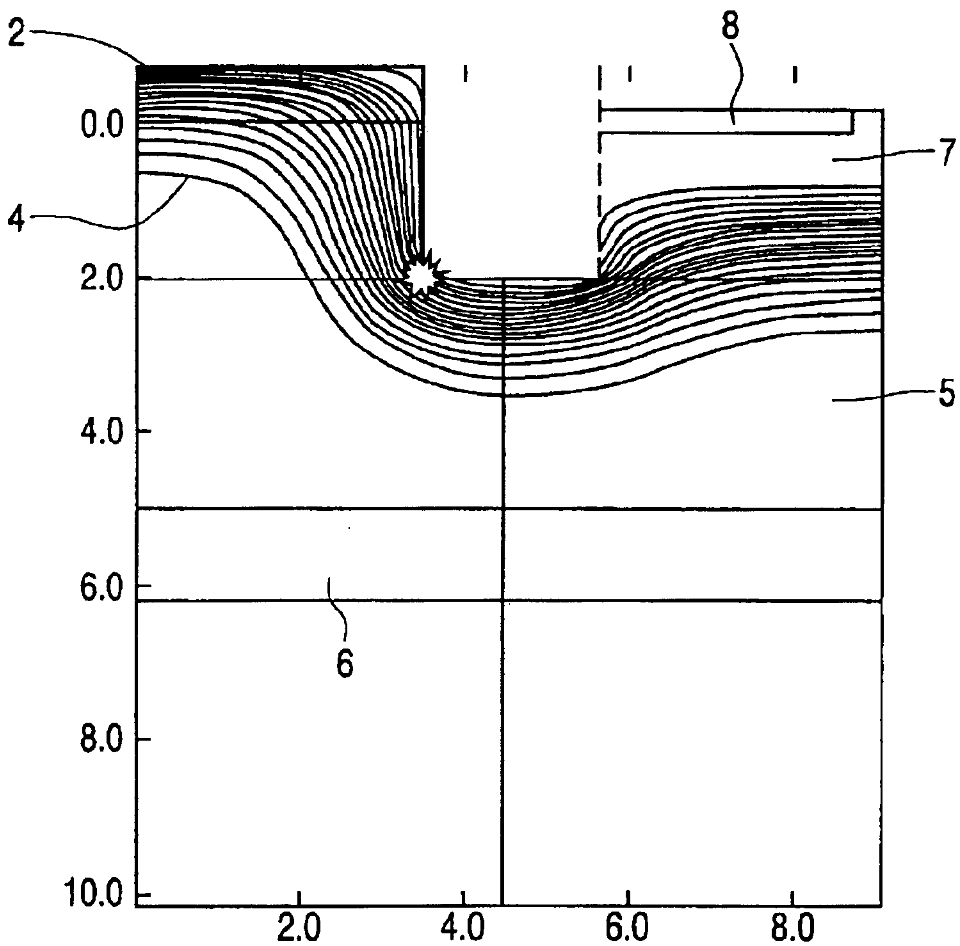
FIG. 1 is a schematic cross-sectional diagram showing simulated iso-potential lines at the edge of a trench network in a trench MOS transistor (MOST)

As shown in FIG. 1, in an optimal low voltage (LV) trench MOS process the p-body implant 7 is implanted after trench 3 formation in order to reduce the p-body implant 7 outdiffusion. Consequently, the p-body implant 7 is not implanted underneath the field oxide 2 including the gate connection and bondpad. In FIG. 1, a two dimensional plot of simulated iso-potential lines at the edge termination (or gate connection) is shown when no precautions are taken. In this example, the epilayer concentration is $1.4\times10^{16}$ cm$^{-3}$, which results in a breakdown voltage in the active cells of 40V, while at the edge the breakdown is 33V. These differences depend on the trench depth and device geometry and may vary.

The edge breakdown voltage could be increased by using a separate p-body implantation along the edges, but that would take an additional mask (step) and is not attractive. Also, the gate connection is not straightforward in a self-aligned process.

Figure 2A:
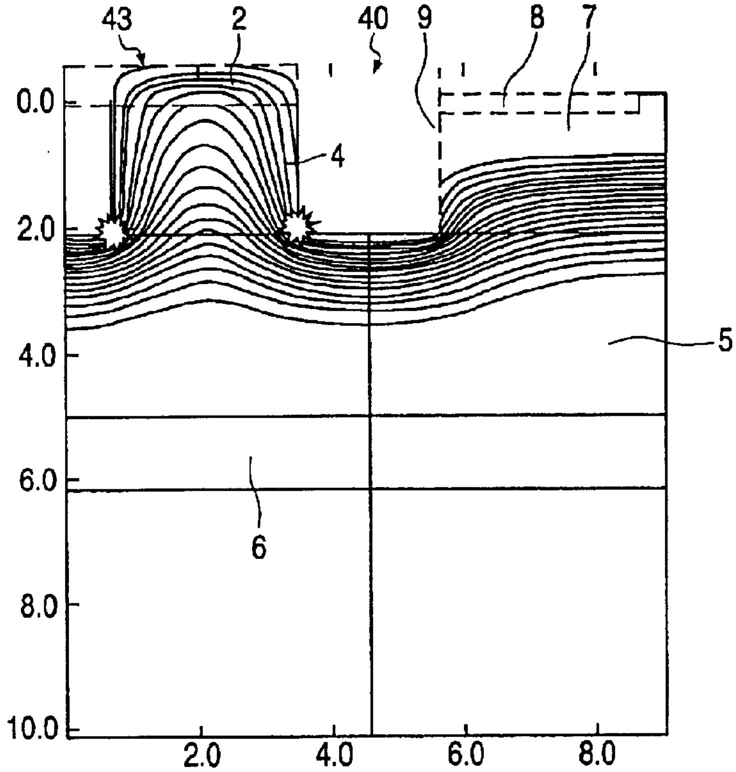
FIG. 2 shows twin cross-sectional views from the side showing simulated iso-potential lines of an edge termination which has an additional gate trench spaced from an active cell, two different spacings are shown.
Figure 2B:
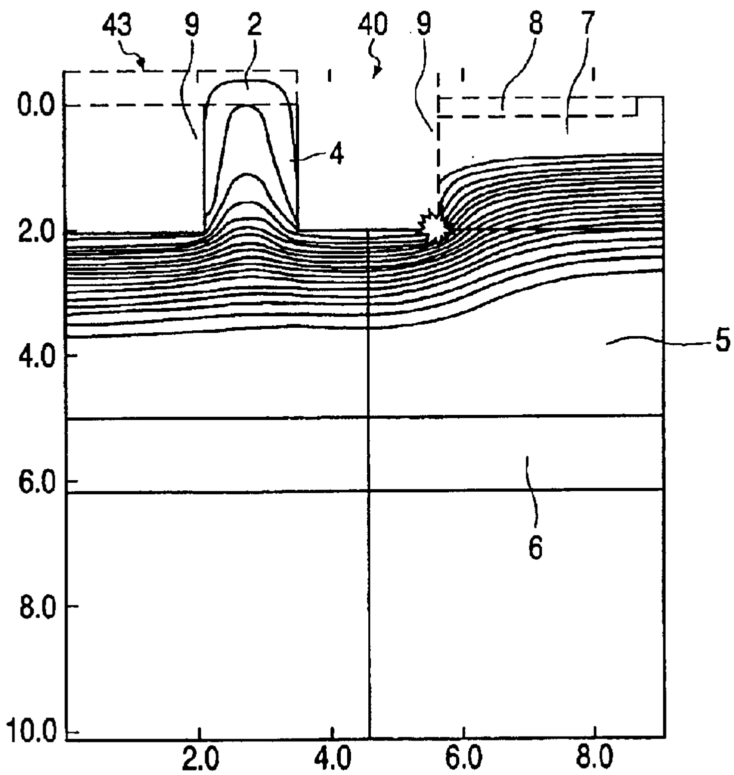
Figure 3:
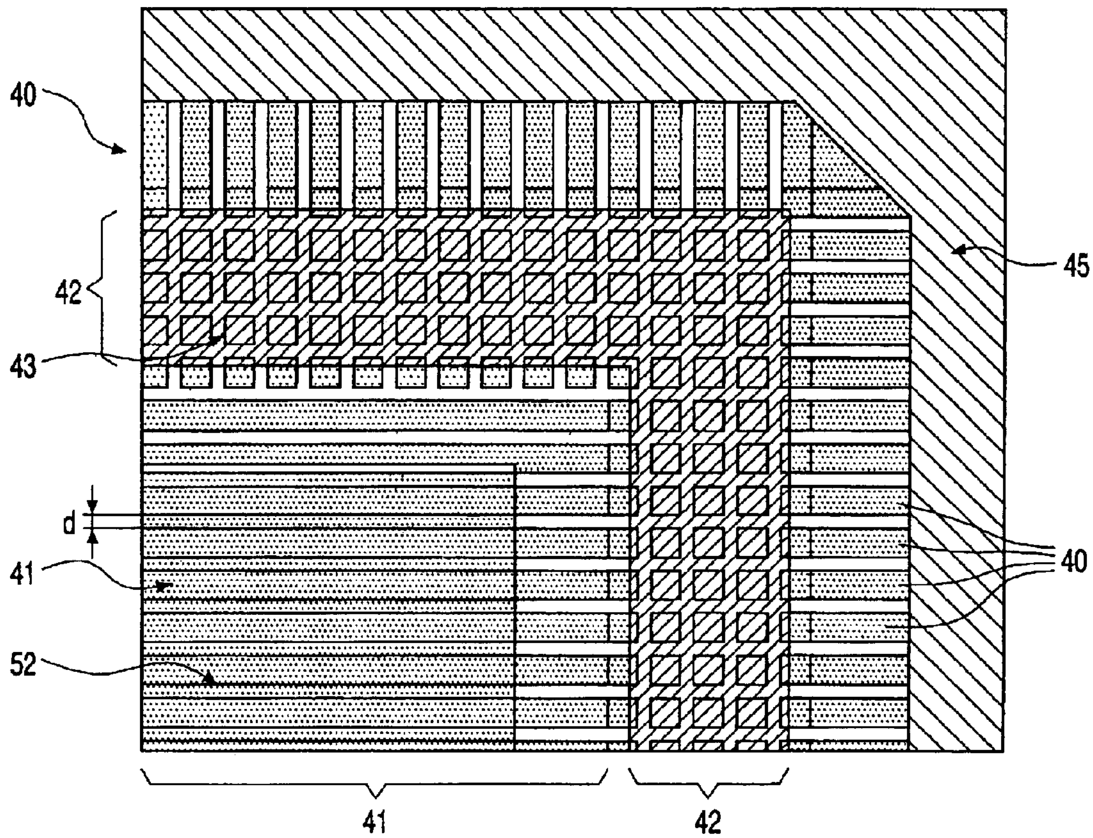
FIG. 3 shows a schematic view from above of a gate bondpad on top of a stripe trench network (with p-body implant connected to the source in a self-aligned process)

In a first embodiment as shown in FIGS. 2 and 3, to avoid the low premature edge breakdown voltage, it is proposed to place additional trenches 40 along an active area 42 formed by active cells 43 of an MOS transistor (MOST) having implant 7, source 8, gate 9, substrate 6, field oxide 4, polysilicon layer 2 and drain (drift) region 5 as in FIG. 1. A requirement of the additional trenches 40, or stripe network 41, is that the distance between the trenches should be such that optimal RESURF is obtained ($N\cdot d\approx10^{12}$ cm$^{-2}$). An example of such a stripe network 40 is shown in FIG. 2, in which the left figure shows the edge termination with an additional trench 2.65 microns away from an active cell 43. This results again in a breakdown voltage of 33V. The right hand figure shows the same structure with the additional gate trench 40 1.0 microns away from the active cell 43, which results in a breakdown voltage of 40V.

Consequently, by using the additional trenches 41, breakdown voltage is greater than or equal to a default edge termination breakdown voltage.

By using a trench stripe network 41 that is connected to a gate bondpad 52 of the MOST, we have the same situation as shown in FIG. 2, but in 3D. Such a configuration is shown in FIG. 3, in which region 11 indicates the gate bondpad 52 including the trench network 41 which does not contain the p-body implant 7. It is therefore important to adjust the mesa width, d, between the stripe trenches 40 according to the RESURF condition. The choice of mesa width also depends on doping concentration. It should be noted that in this structure there are no electrically floating areas, hence the p-body implant 7 of the inactive cells (beneath the gate bondpad 52) is connected to the source 8, because use is made of the stripe trench network 41. It could be advantageous to use the same kind of stripe trench network 41 for other edge termination schemes.

By surrounding the gate bondpad 52 with additional active cells 43, eg. squares or hexagons, the breakdown voltage would be in the worst case determined by the sidewall diffusion of the p-body implant 7. In region I, the active cells 43 are surrounded by a second region of stripe cells 40 in order to have a non-floating p-body implant 7 at the edge of the device. Here, the p-body implant 7 is interrupted by the field oxide region 45 and due to its outdiffusion, the breakdown voltage is determined by the edge curvature of the field oxide region 45. It has been calculated by using 2D simulations that the breakdown voltage due to the p-body implant 7 edge curvature underneath the field oxide 45 is 37V, which is higher than the breakdown voltage without taking any edge termination precautions (see breakdown voltage=33V in FIG. 1).

Note that another advantage of this layout is that because the trench network lies underneath the gate bondpad 52, there are no problems concerning the external connection with the gate.

An alternative to the structure in FIG. 3 is to eliminate the trenches at the edge and have the active cells at the edge abutting a field oxide section 45. Also, by using an additional trench network filled with a dielectric and placed along the edges of the active area 42, the p-body implant 7 diffusion at the edges is stopped and therefore the curvature is less. Hence the curvature breakdown voltage has increased.

A second embodiment of RESURF trench gate MOST has a sufficiently small pitch (close spacing of neighbouring trenches) that intermediate areas of a drain drift region 5 are depleted in the blocking condition of the MOST. However, premature breakdown can still occur in this known device structure at the perimeter/edge of the device area and/or adjacent the gate bondpad 52.

To counter this premature breakdown, the second embodiment adopts two principles: the first, as shown in FIGS. 7*a* and 7*b*, is that the gate bondpad 52 is either connected to an underlying stripe trench network 58 surrounded by active cells 54, or is directly on top of the active cells 54, as described in the first embodiment; the second principle uses a compatible 2D edge termination scheme provided around the RESURF active device area. Examples of the second principle can be found in the applicant's co-pending application WO 01/08226 referred to above.

An earlier patent (U.S. Pat. No. 5,637,898) concerns trench MOST devices, which make use of (optimal) RESURF. However, for the kind of device disclosed in this patent, the edge termination is still a problem. Several edge termination schemes, as disclosed in U.S. Pat. No. 5,998,833 in the name of Baliga and WO 01/08226 referred to above, proposed solutions, but these were only 2D solutions and not 3D solutions. Nevertheless, these edge termination schemes can be used in the 3D edge termination concept if proper care has been taken for the gate bondpad 52 and of course the device. It was shown in the previous embodiment that by placing the gate bondpad 52 in the active area 42, the trench network 58 underneath the bondpad 52 can be used for obtaining RESURF condition. In this way, premature breakdown due to the external gate connection can be avoided. Therefore, several new 3D device concepts have been proposed based on two principles, as shown in FIGS. 4*a* and 4*b;* in order to avoid premature breakdown near the gate bondpad 52, the gate bondpad 52 should be placed in, or attached to, the active area 42 as was proposed in the first embodiment for low voltage devices;

a 2D edge termination scheme may be used eg. as suggested in WO 01/08226.

Keeping both of these principles in mind, it can be shown by using device simulations that the new 3D device concepts could be transferred into the production of real products. Also, the processing of these devices could be a self-aligned process, which appears to be fairly difficult but realistic. The general concept of using these two principles could be used in all types of RESURF devices that use eg. semi-insulating layers, trench field plates and multiple (super) pn-junctions (eg. As disclosed in U.S. Pat. No. 4,754,310).

In FIGS. 4*a* and 4*b*, the general concept is shown schematically. In these figures, a square device has been chosen, but other shapes can also be used as is shown later in this description.

An edge field plate 50 as shown in FIG. 4*b* could be connected either to the source of the MOS device or to the gate. Furthermore, it could be made of metal or poly-silicon or a semi-insulating layer (SIPOS). The substrate 6 in this example is an n-type substrate. The 2D edge termination could also be formed by other 2D edge termination schemes, such as Kao rings or semi-insulating layers. This depends on the type of active cells 54 e.g. active cells containing semi-insulating material in the trench need an edge termination having the same semi-insulating layer.

By using this device structure, it would be possible to use square unit cells containing, for example, step oxide trenches or semi-insulating trenches. However, underneath the gate bondpad 52, the active cells 54 will be floating, since the p-body implant 60 (see FIG. 7*b*) of the active cells 54 is not connected to the source 43, (except for the stripe network in FIG. 7*b*). These active cells 54 could be formed by, for example, p-body 60 and/or source 43 implantation before trench formation.

It should be noted that the field plates 55 as shown in FIG. 7*b* are partially electrically floating. The non-floating part is caused by the fact that the hexagon cells 57 just at the edge contact the gate, but because of the spacer etch, which happens at the edge, the outer cells in the inactive (edge) 57 region are floating.

In principle, it is attractive to have an edge termination scheme that is less dependent on the processing sequence. It would be possible to consider using a double poly-silicon process where the active cells 54 underneath the gate bondpad 52 can be connected such that there is no short-circuit between the gate and the source. However, despite this new idea, the solution is quite difficult and may be expensive.

In order to keep the devices underneath the gate bondpad 52 non-floating (or active), other cell structures should be proposed. A solution for p-body/source implantation before trench formation could be to use structures as shown in FIG. 3, discussed in relation to the first embodiment.

The unit cells underneath the gate bondpad 52 could be rectangular structures, with a length being equal to either half or the complete bondpad 52 width. Typical unit cells as these are shown in FIGS. 5*a* and 5*b*, viewed from above.

Breakdown voltages (V) (y axis) for a 10×1 $\mu m^2$ rectangular cell (as shown in FIG. 5*a*) are shown in FIG. 6 for varying doping concentration ($cm^{-3}$) (x axis). The breakdown voltage of the 2D optimised device is approximately 58V for a doping concentration of $N=10^{17}$ $cm^{-3}$. Note that because of practical reasons a uniform doping concentration in the drift region was taken which doesn't give a uniform field just near breakdown. This could result in higher breakdown voltage than calculated in FIG. 6. The same calculations were done for a doping concentration of $N=10^{17}$ $cm^{-3}$ for varying stripe lengths of these unit cells. In these calculations, the breakdown voltage was 16V near the 3D trench corner.

Consequently, it appears that for a uniformly doped stepped oxide device, the unit cell devices as shown in FIGS. 5*a* and 5*b* cannot be used underneath the gate bondpad 52. Therefore, other structures should be proposed as shown in FIGS. 7*a* and 7*b*.

One idea would be to use a hexagon cell where the p-body 60 and source 43 are implanted after trench formation as shown in FIG. 7*a/b*.

In FIGS. 7*a* and 7*b* the active unit cells 54 are hexagon cells. Although not shown the edges of the gate bondpad may follow the active cell shapes so that the bondpad only covers complete (in this case) hexagon cells. The same may apply to other cell shapes. The edge termination denoted by section I in FIG. 7*b* is based on the idea that was discussed in WO 01/08226 by using poly-silicon spacers 56. The first edge termination spacers 56 are connected to the active network 42, but the outer cells are left floating, which is an advantageous feature of this device, because in this way the edge termination is created as proposed in WO 01/08226.

The solution in the latter could give problems in relation to high reverse bias switching. Therefore, an oxide layer 59 between the poly-silicon spacers 56 should be made thick in order to reduce the capacitive effect.

Advantages are achieved by using the poly-silicon spacers 56 in the trenches at the edge of the device and placing the gate bondpad 52 in the active area 42.

The section marked 11 in FIG. 7*b* has been simulated and the results for breakdown voltage (V, y axis) are shown in FIG. 8 against mesa width (μm, x axis). The gate bondpad 52 lies on top of non-active hexagon cells 58, which also make use of the RESURF principle. The default active device layout has been used as proposed in U.S. Pat. No. 5,637,898, but with another p-body 60 and a uniform epi doping concentration. The mesa width of the unit cells 58 underneath the gate bondpad 52 were varied which resulted in an optimum value of the breakdown located in the active area 42, as shown by the higher values in FIG. 8. By using a narrow cell width, the breakdown occurs at the bottom of the trench in the cells 58 underneath the gate bondpad 52. By increasing the mesa width too much the breakdown occurs underneath the gate bondpad 52 in the top of the unit cells 58.

The figures of merit for hexagon (active) unit cells 54 were calculated and compared with the results of the stripe (active) cells (in FIG. 3 see stripes 40). The results are shown in FIGS. 9*a* and 9*b*, in which stripe cell values are denoted by squares and hexagon cell values by dots, with doping in cm-3 shown on the x axis and breakdown voltage (V) on the y axis in FIG. 9*a* and specific on resistance ($m\Omega.mm^2$) on the y axis in FIG. 9*b*. In these figures, several effects can be noticed.

Firstly, the maximum breakdown voltage in the hexagon cell (shown by circular data points) never reaches the value of that of the stripe cell configuration (square data points). The reasoning for this is simply because the RESURF was optimised for 2D structures only (rather than 3D). For optimised 3D RESURF in hexagon cells, other methods could be used, for example, semi-insulating layers or linearly graded doping profiles in the drift region which may have other slopes in the drift region than defined in U.S. Pat. No. 5,637,898. For the latter, a linear potential is formed which is not the case for a uniformly doped drift region having a constant field plate as simulated in FIGS. 9*a* and 9*b*.

Secondly, the specific on-resistance of the hexagon cell 54 is greater than that of the stripe cell configuration 40 (FIG. 3). This is due to less current spreading in the hexagon cell as shown in FIGS. 10*a* and 10*b*.

Typical characteristics of the device in FIGS. 7*a*/*b* are the gate bondpad 52 in the active area 42; (partially) floating field plates with polysilicon spacers 56; a self-aligned process of production; no active cells 54 under the gate bondpad 52, which cells 54 can have a floating p-body 60 or no p-body. The (partially) floating field plates 55 with polysilicon spacers 56 could also be used in LV devices by using hexagonal cell structures but the area beneath the gate bondpad 52 should have (floating) p-body.

Hence, another structure should be developed which doesn't have the disadvantage of having a low breakdown voltage due to corners in stripe cells and doesn't have the disadvantage of having less current spreading, as shown by hexagon cells. Therefore, the ring structure shown in FIG. 11 is proposed. A cross-section would be similar to that shown in FIG. 7*b*. The advantage of this structure is that there are no corners and the specific on-resistance goes slowly to the value of the stripe cells discussed above when more trench rings are used. In the structure in FIG. 11 a circular trench 70 has been made in the centre of the device in order to retain the high breakdown voltage as achieved in 2D stripe cells. Circular mesa sections 72 are located between the central trench 70 and circular outer trenches 74. The gate bondpad 52 is connected as shown. For the edge, the same 2D edge termination scheme can be used as proposed in WO 01/08226 as mentioned above.

The structure in FIG. 11 can be characterised as follows: the gate bondpad 52 in the active area; edge termination as described in WO 01/08226 or (partially) floating field plates; active cells 70 under the gate bondpad; a self-aligned production process; and a circular repetitive pattern.

The structure above was simulated for three trench rings (or two unit cells) for $N=10^{17}$ $cm^{-3}$ with a trench width in the centre of 1 micron. It is expected that the unit cell which is closest to the centre affects the RESURF the most, since the field plate perimeter is large compared to the volume of the drift doping in the mesa region 72. Therefore, this mesa width was changed and the breakdown voltages and specific on-resistances were calculated, and are shown in FIGS. 12*a* and *b*, in which the axes and scales are the same as for FIGS. 9*a* and 9*b*. As can be seen, the breakdown voltage can still be the same as achieved in a 2D situation and the specific on-resistance in between that of a stripe and a hexagon configuration, as shown in FIGS. 10*a* and 10*b*, which represents current flows for a hexagon cell (10*a*) and stripe cell (10*b*) having substrate 6, drift region 5, gate 7, source 8 and p-body 60 as above.

Consequently, many other variations are possible, for example, changing the trench width and mesa width for different radii, more poly-silicon layers for gate connection, etc.

In FIG. 13, several other designs are proposed, each having a generally similar cross-section to that in FIG. 7*b*. Variants b), c), d), and e) have the gate bondpad 52 connected to one or more central trenches 70 with outer trenches 74 bounded by mesa 72.

Square active cells in the area 42 surrounded by stripe edge cells 40 in FIG. 13(*a*) could only work for "optimal" RESURF devices because of corners.

Hexagon stripe cells 70/74 as shown in FIG. 13(*b*) would work in principle. The disadvantages of this being that there would be poly-silicon layers 75 (for connection to the gate bondpad 52) across the active area. An advantage would be when used for high voltage RESURF devices giving less variation in mesa 72 width for different radii when compared with the structure shown in FIG. 11.

Grouped circle stripe cells 70/74 as shown in part (c) of FIG. 13 have the disadvantage that open areas (i.e. areas existing when three or more complete circular cells are connected to each other with their outer trench ring) and poly-silicon layers 75 (for connecting each circular cell to the gate bondpad) are located across the active area. An advantage would be that optimal RESURF could be achieved because of less variation in mesa width.

Rectangular stripe cells 70/74 as shown in FIG. 13(*d*) have the disadvantage of having corners, but are less of a problem than in square cells. An advantage of these rectangular stripe cells is that they are close to stripe active cells.

The ellipsoid stripe cells 70/74 shown in FIG. 13(*e*), have the advantage of being close to stripe active cells.

Figure 13A:
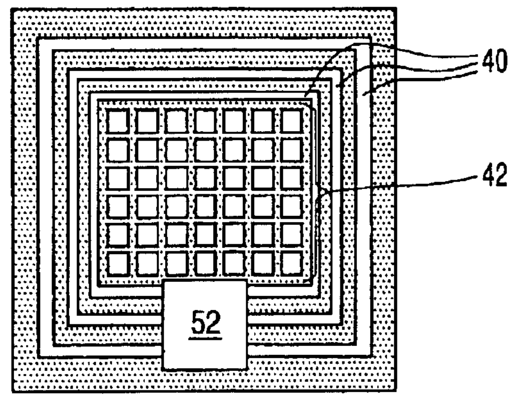
Figure 13B:
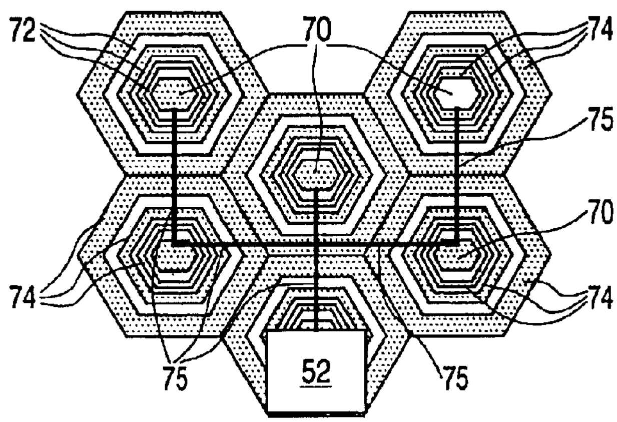
Figure 13C:
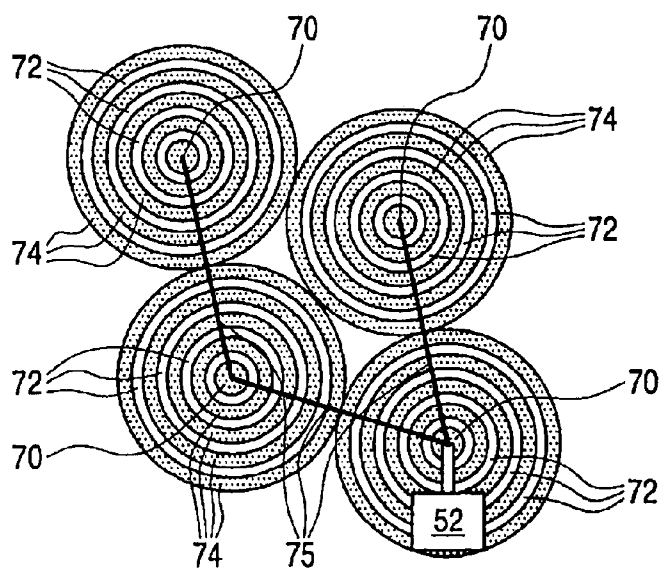
Figure 13D:
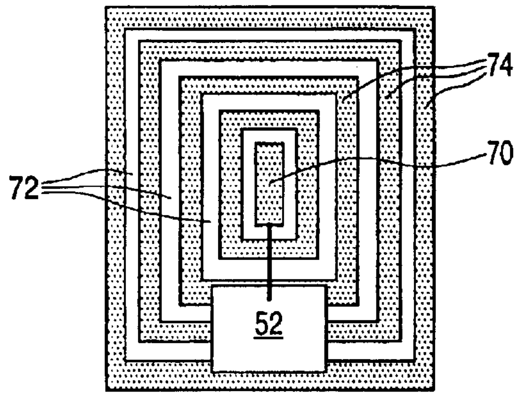
Figure 13E:
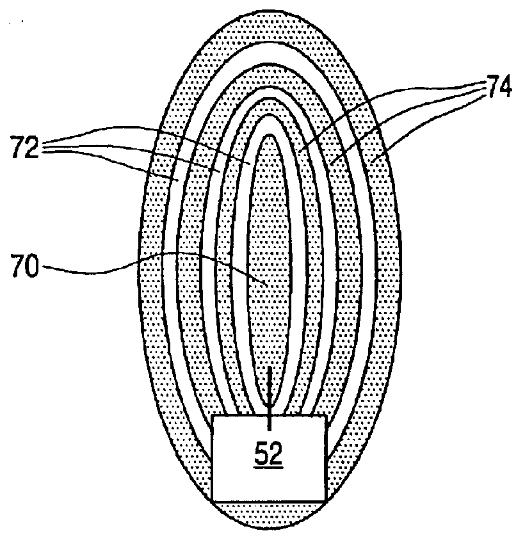
Figure 13F:
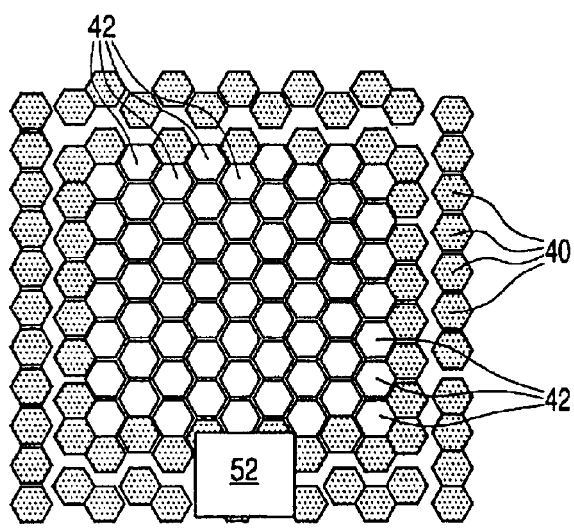

Finally, hexagon active cells 42 and hexagon edge cells 40 as shown in FIG. 13*f* would have similar properties to those in FIG. 13*a*, but the cells have less corner problems.

From the foregoing, it will be appreciated that the basic concept of having a gate bondpad 52 in the active area (attached thereto) of an MOS device and solving the edge termination problem in a simple way, such as using a (partially) floating trench at the edge of the low voltage self-aligned device or using edge termination described in WO 01/08226 for medium voltage RESURF devices provides significant advantages.

The device may advantageously be a self-aligned device.

In addition, placing the gate bondpad in the active area is advantageous for switching because of a reduction of the gate resistance. In this way, there is more uniform (gate) current spreading through the (gate) trench network than would be in conventional trench MOS concepts, in which the gate is only connected at the edge which could be too far away from the active cells at the other (outer) edge.

The benefit of the different types of trench ring shown in FIG. 13 is that no (or fewer) corners are provided, to thereby reduce the problem of premature breakdown.

The cellular trench gate embodiments disclosed herein are generally constructed as follows with reference to FIGS. 7*a* and 7*b*: a semiconductor device comprises active device cells 54 in a cellular area 42 of a semiconductor body, wherein each active device cell 54 has a channel accommodating region 60 of a second conductivity type between a surface adjacent source region 43 and an underlying drain region 5, 6 that are of a first conductivity type; an insulated gate trench 54 accommodating the trench gate 9 extends from the source region 43 through the channel accommodating region 60 and into the underlying drain region 5, 6, the trench gate 9 being dielectrically coupled to the channel accommodating region 60 by an intermediate gate dielectric layer 9*b* at sidewalls of the gate trench 54; and wherein above the active cell area or above a subsidiary inactive area within the active area there is a gate bondpad 52 for making an electrical connection to the active area of the device.

From reading the present disclosure, other variations and modifications will be apparent to persons skilled in the art. Such variations and modifications may involve equivalent and other features which are already known in the manufacture of semiconductor devices and which may be used instead of or in addition to features already described herein. The present invention may be applied to power MOSFETs of the planar DMOS type (instead of the trench-gate type), i.e. the MOS gate may be present on a dielectric layer on the body surface (instead of in a trench). It may be applied to solve similar problems in other semiconductor devices, for example bipolar transistors (instead of MOSFETs). The active device area of such devices may be cellular or not. Thus, the present invention may be used generally to provide a gate bond pad connection to an active device area.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to any such features and/or combinations of such features during the prosecution of the present Application or of any further Application derived therefrom.

What is claimed is:

1. A semiconductor device comprises:

a semiconductor body having an active cell area wherein trenches containing gate material extend into the semiconductor body from a surface thereof, and wherein adjacent to each trench gate there is a source region at said semiconductor body surface;

the semiconductor body also having an inactive cell area wherein trenches containing gate material extend into the semiconductor body from the surface thereof, and wherein the source region is not present;

characterised in that a gate bondpad at least partially overlies the active cell area, or an area substantially surrounded by the active cell area, and is connected thereto.

2. A semiconductor device as claimed in claim 1, in which the gate bondpad overlies and is located substantially entirely within the active cell area.

3. A semiconductor device as claimed in claim 2, in which a subsidiary inactive cell area is located beneath the gate bondpad, and is contained within the active cell area.

4. A semiconductor device as claimed in claim 1, in which the perimeter of the device includes a termination area.

5. A semiconductor device as claimed in claim 4, in which the edge termination area is a trench network, forming a non-floating p-type or n-type implant.

6. A semiconductor device as claimed in claim 4, in which the edge termination area comprises at least one floating poly-silicon spacer used as a field plate.

7. A semiconductor device as claimed in claim 4, in which the edge termination area comprises a field plate on dielectric material in a perimeter trench, which dielectric material forms a thicker dielectric layer than a dielectric layer on said gate material in the active cell area.

8. A semiconductor device as claimed in claim 4, in which the edge termination area is constructed according to a Kao ring scheme.

9. A semiconductor device as claimed in claim 4, in which the edge termination area is constructed according to known 2D edge termination schemes.

10. A semiconductor device as claimed in claim 1, in which cells in the active area are surrounded by a plurality of substantially concentric ring trenches.

11. A semiconductor device as claimed in claim 10, in which the ring trenches are substantially circular or are substantially elliptical.

12. A semiconductor device as claimed in claim 10, in which the ring trenches are substantially polygonal, for example square ring trenches, rectangular ring trenches or hexagonal ring trenches.

13. A semiconductor device as claimed in claim 10, in which a plurality of cells have a common set of outer concentric ring trenches.

14. A semiconductor device as claimed in claim 10, in which the ring trenches have different widths.

15. A semiconductor device as claimed in claim 10, in which the cells are joined to a common gate bondpad.

16. A semiconductor device as claimed in any one of the preceding claims, in which the trenches in the active and inactive cell areas are sufficiently closely spaced (sufficiently small pitch) that intermediate areas of the drain drift region are depleted in a blocking condition of the device.

* * * * *